United States Patent [19]
Gersbach et al.

[11] Patent Number: 5,539,342
[45] Date of Patent: Jul. 23, 1996

[54] LOW DISTORTION MEMORY WRITE CURRENT HEAD DRIVE

[75] Inventors: John E. Gersbach, Burlington, Vt.; Shujaat Nadeem, Kew Garden, N.Y.

[73] Assignee: International Business Machines Corporation, Armonk, N.Y.

[21] Appl. No.: 420,460

[22] Filed: Apr. 10, 1995

Related U.S. Application Data

[63] Continuation of Ser. No. 150,502, Nov. 9, 1993, abandoned.

[51] Int. Cl.[6] ............................... H03K 3/01; H03K 1/02
[52] U.S. Cl. ........................ 327/110; 327/108; 327/377; 327/382; 327/423; 327/170; 360/46; 360/67
[58] Field of Search ............................ 307/270, 592, 307/442, 252, 256, 542, 572, 570, 640, 644, 242; 327/110, 108, 379, 384, 104, 103, 112, 376, 377, 382, 423, 170; 326/82; 360/46, 67

[56] References Cited

U.S. PATENT DOCUMENTS

| | | | |
|---|---|---|---|
| 3,770,986 | 11/1973 | Drehle | 307/255 |
| 4,381,487 | 4/1983 | Erickson | 330/306 |
| 5,107,142 | 4/1992 | Bhamidipaty | 307/570 |
| 5,280,196 | 1/1994 | Shinozaki | 307/270 |
| 5,379,208 | 1/1995 | Shinozaki | 327/110 |

*Primary Examiner*—Timothy P. Callahan
*Assistant Examiner*—Dinh T. Le
*Attorney, Agent, or Firm*—Calfee Halter & Griswold

[57] ABSTRACT

An electrical current-switching driver circuit is provided for switching current through an inductive memory write head on a memory storage device. The driver circuit provides means for reducing distortion in the output current waveform and for minimizing occurrences of breakdown in the switching transistors in the circuit. The circuit uses AC coupling circuitry and small DC holding currents to linearize the current transition during switching transients, thereby eliminating discontinuities which would otherwise appear in the head current output waveform, midway through the switching transients.

19 Claims, 8 Drawing Sheets

LOW DISTORTION MEMORY WRITE CURRENT HEAD DRIVE

This is a continuation of application Ser. No. 08/150,502 filed on Nov. 9, 1993 and now abandoned.

TECHNICAL FIELD

The present invention relates generally to storage devices for computer systems and more particularly to an improved low distortion driver circuit for writing to such storage devices.

BACKGROUND OF THE INVENTION

Computer systems typically use direct access storage devices (DASDs) for at least part of their memory storage. DASDs may include for example, a head-disk assembly (HDA) which comprises a hard disk and an actuator arm on which resides an inductive write head for writing to the hard disk. An actuator electronics (AE) module, which also typically resides on the actuator arm, provides the electrical current required by the inductive write head to write to the hard disk. The AE module is often implemented in integrated circuit chip form containing on-chip write driver circuitry. The write driver circuitry facilitates write operations by forcing current though the inductive write heads on the actuator arm.

Figure 1:
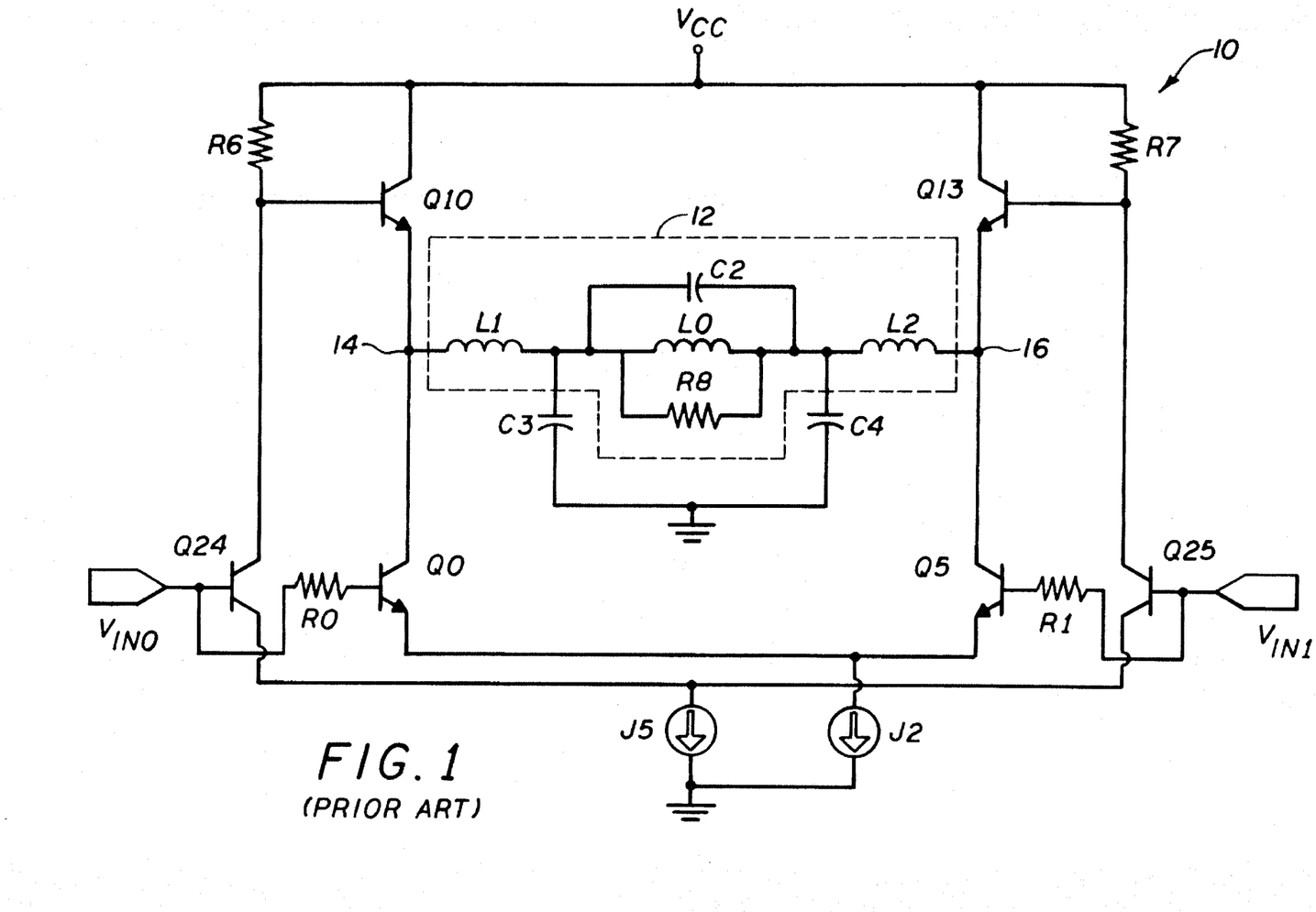
FIG. 1 is a schematic diagram of a prior art circuit including an inductive memory write head and head current driver circuitry.

As the performance of memory devices for computer systems increases, so too does the requirement for advanced driver circuits. A schematic diagram representing a typical write driver circuit 10 for providing current to a write head 12 is shown in FIG. 1. The portion of the figure representing the inductive write head 12 is enclosed in dashed lines near the center of the Figure. The write driver circuit 10 switches current to the inductive write head 12 and comprises current sources J2 and J5; resistors R0, R1, R6 and R7; and npn-type transistors Q0, Q5, Q10, Q13, Q24 and Q25. $V_{cc}$ provides a voltage supply for the circuit, and is typically on the order of five VDC (volts DC). $V_{in0}$ and $V_{in1}$ are differential voltage input signals which switch current through the inductive write head 12 in opposite directions, depending on whether $V_{in0}$ is greater or less than $V_{in1}$. The current for the inductive write head 12 is provided across two switching outputs 14 and 16 of the circuit 10, located at the emitters of transistors Q10 and Q13, respectively.

The inductive write head comprises head inductors L0–L2, capacitor C2, and resistor R8. Capacitors C3 and C4 represent inherent capacitances introduced by the wire connecting the inductive write head 12 and the write driver circuit 10 on the actuator arm which are typically separated by a couple of inches on the arm. Because the capacitances C3 and C4 are connected at one end to the inductive write head 12 and at the other end to ground, the inductive write head is completely floating (in terms of electrical potential) between the switching outputs of the driver circuitry at the output terminals 14 and 16 of the driver circuit 10.

The circuit of FIG. 1 operates in the following manner. If the voltage differential $V_{in0}-V_{in1}$ is positive, that is, $V_{in0}$ is greater than $V_{in1}$, the current from current source J2 turns on transistor Q0 and the current from current source J5 flows through transistor Q24. Current flows from $V_{cc}$ through transistor Q13, and through the inductive write head 12 from switch output 16 to switch output 14. The current continues through transistor Q0 and down to current source J2. The current through transistor Q0 is on the order of 50 milliamps.

The current provided by current source J5 is a smaller current than that provided by current source J2 and causes a voltage drop across R6 which keeps transistor Q10 off. Ideally, as long as Q10 remains completely off, all of the current provided to the collector of transistor Q0 is provided by transistor Q13 through the inductive write head 12, and no portion of the total current provided to the collector of Q0 is supplied by Q10. However, the circuit 10 does not operate ideally because, during switching transients when the direction of current through the inductive write head changes, the voltage at the emitter of Q10 is variable. If at some point during the switching transient the voltage at the emitter of Q10 drops 0.7 volts below its base voltage, Q10 will be turned on. If Q10 is turned on, it will supply a portion of the current to the collector of Q0 in addition to that already provided by Q13, thereby causing distortion in the output current waveform through the write head 12. This distortion is manifested as a discontinuity in the head current waveform as it passes through zero current midway through the switching transient.

If the voltage differential $V_{in0}-V_{in1}$ is negative, that is, $V_{in0}$ is less than $V_{in1}$, the current from current source J2 turns on transistor Q5 and the current from current source J5 flows through transistor Q25. The current through Q5 flows from $V_{cc}$ through Q10, and through the inductive write head 12 from switch output 14 to switch output 16. The current continues through Q5 and down to current source J2. The smaller current provided by current source J5 provides a voltage drop across R7 which keeps Q13 off. Ideally, as long as Q13 remains completely off, all of the current provided to the collector of Q5 is provided by Q10 through the inductive write head 12, and no portion of the total current provided to the collector of Q5 is supplied by Q13. During the switching transient, however, the voltage at the emitter of Q13 is variable and if at some point during this switching transient the voltage at the emitter drops 0.7 volts below its base voltage, Q13 will be turned on. Q13 will then supply a portion of the current to the collector of Q5, thereby causing a discontinuity, or distortion, in the output current waveform through the write head 12.

Changing the polarity of the input voltage differential between $V_{in0}$ and $V_{in1}$, then, causes the direction of the current through the inductive current head 12 to change, and results in distortion in the resulting inductor current waveform midway through the switching transient. The same type of distortion in the current output waveform may also occur if either of the transistors Q0 or Q5 go into saturation while turning on. In such a case, the resulting distortion in the output current waveform at the emitters of Q10 and Q13 is likely to exceed the limits which manufacturers place on pulse width variations in the inductive write head current waveform.

One manner of correcting for the discontinuity in the current output waveform experienced during the switching transients is to ensure that the emitters of transistors Q13 and Q10 are provided with a voltage swing sufficient to prevent (i) both of the transistors from turning on during the transient and (ii) saturation of the primary conducting transistor during the transient. In order to provide such a voltage swing, either a higher voltage supply $V_{cc}$ may be used or a reverse bias may be supplied to the base of Q10 (when the voltage differential $V_{in0}-V_{in1}$ goes positive) or to the base of Q13 (when the voltage differential $V_{in0}-V_{in1}$ goes negative). However, if a reverse bias voltage is provided, it will remain across the emitter-base junction of Q10 and Q13, respectively, even after the switching transient is complete, and may increase the potential for emitter-base breakdown during normal operation of the switch circuitry. The emitter-base breakdown typically occurs when the maximum reverse bias base voltage coincides with the highest positive voltage swing at the emitter of Q10 (or Q13). Emitter-base breakdown also presents a problem when higher voltage supplies are utilized, because higher supply voltages tend to accelerate emitter-base breakdown of switching transistors. If, for example, $V_{cc}$ is designed to provide +10 or +12 VDC instead of +5 VDC, this higher voltage will likely exceed the junction breakdown limit of the bipolar npn transistors used in the circuit of FIG. 1.

Thus it is an object of the present invention to provide an improved low distortion memory write current head driver which minimizes discontinuities in the driver output current, while utilizing a standard +12 VDC supply voltage, without increasing the potential for junction breakdown of switching transistors in the driver circuitry. It is a further object of the invention to provide such a current head driver which is capable of switching up to 120 milliamps of current in less than 5 nanoseconds.

SUMMARY OF THE INVENTION

The present invention provides a current switching driver circuit for switching electrical current through an inductive memory write head on a memory storage device. The driver circuit provides means for reducing distortion in the output current waveform and for minimizing occurrences of junction breakdown in the switching transistors in the circuit. The circuit uses AC coupling circuitry and small DC holding currents to linearize the current transition during switching transients, thereby reducing discontinuities which would otherwise appear in the head current output waveform, midway through the switching transients.

DETAILED DESCRIPTION OF THE PREFERRED EMBODIMENT

Figure 2A:
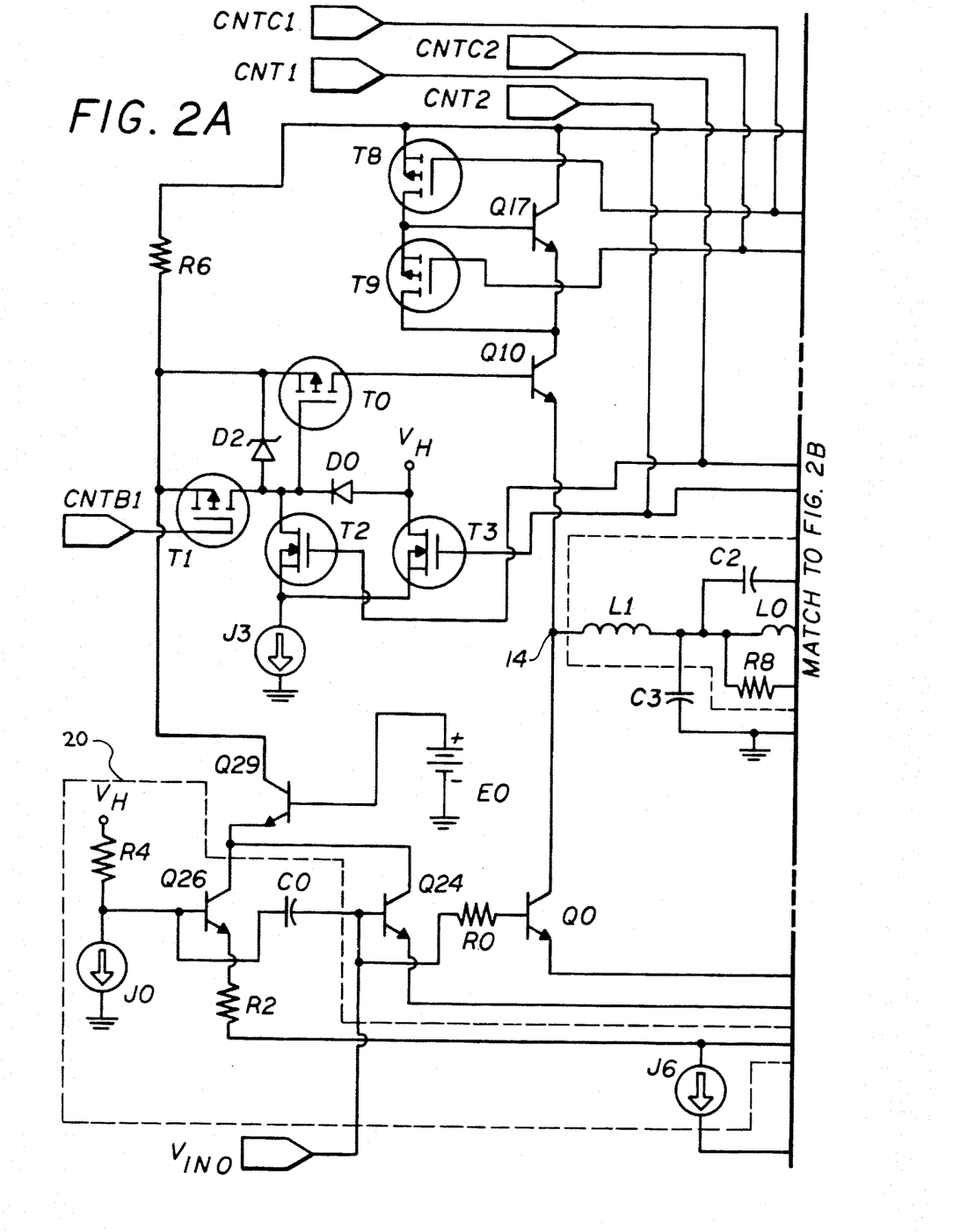
FIGS. 2A and 2B, taken together, are a schematic diagram of a circuit, constructed according to the principles of the present invention, which includes an inductive memory write head and improved head current driver circuitry.
Figure 2B:
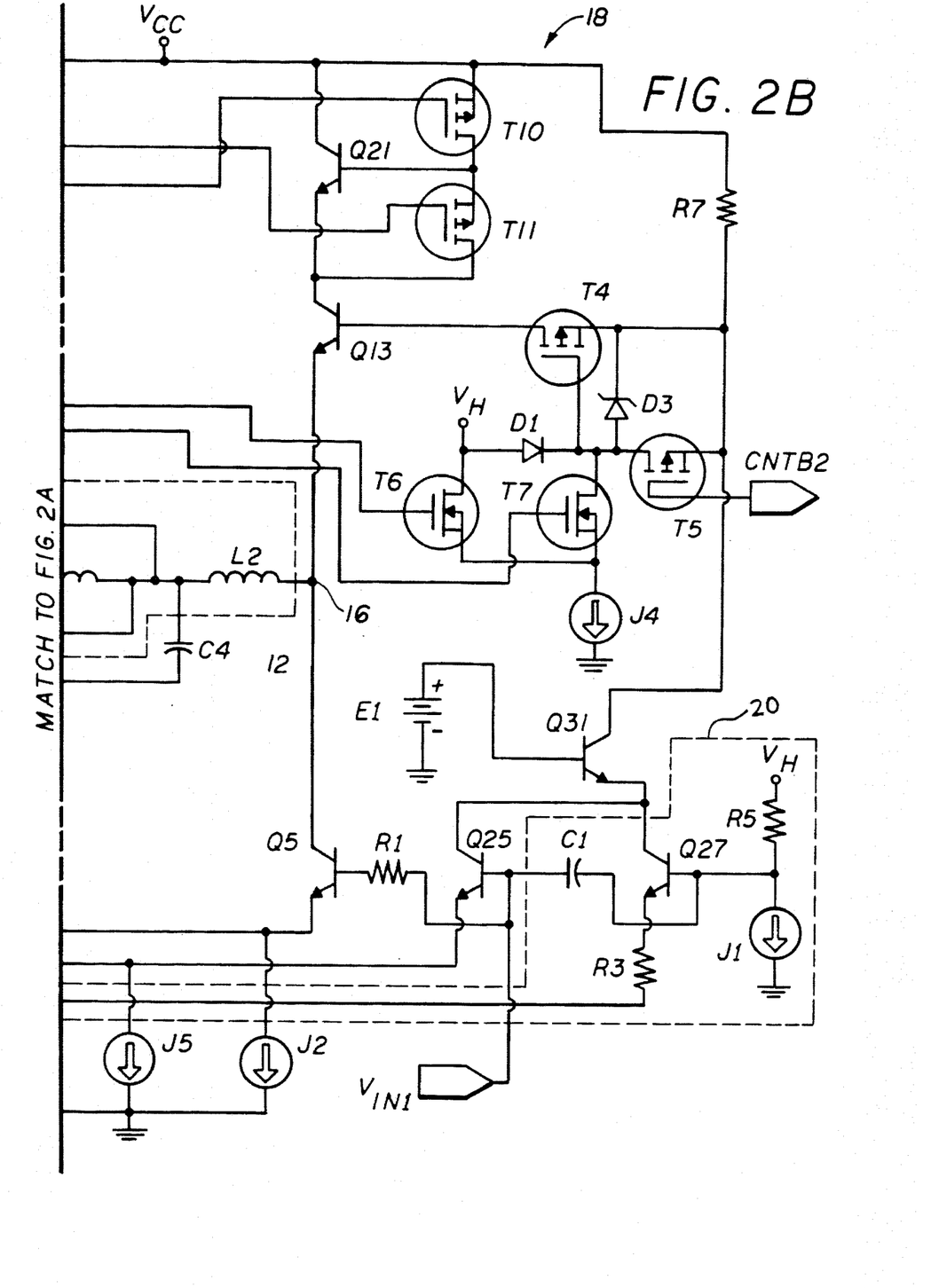

The present invention, as shown in FIGS. 2A–2B, provides driver circuitry 18, which may be used with the inductive write head 12 of FIG. 1, but which overcomes the noted inherent disadvantages of the prior art head driver circuitry shown in FIG. 1. The circuitry 18 of FIGS. 2A–2B contains all of the components of the circuit of FIG. 1, along with additional components as hereinafter described.

The improved circuitry 18 of FIGS. 2A–2B operates at a voltage significantly higher than that at which the prior art circuitry of FIG. 1 operates. $V_{cc}$ in FIGS. 2A–2B is provided by a standard +12 VDC power source. $V_H$ is a second voltage supply provided by a +5 VDC power source. AC coupling circuitry and a small DC holding current are utilized in the circuit of FIGS. 2A–2B to reduce distortion in the head current output waveform, which otherwise might be expected in driver circuitry operating at +12 VDC.

All of the transistors shown in FIGS. 2A–2B are either npn bipolar transistors, n-type field effect transistors (NFETs) or p-type field effect transistors (PFETs). In FIGS. 2A–2B, bipolar npn transistors are designated in the circuit 18 as Q0, Q5, Q10, Q13, Q17, Q21, Q24–27, 29 and Q31; PFETs are designated as T0, T1, T4, T5, and T8–11; and NFETs are designated as T2, T3, T6, and T7.

Ignoring for a moment the control signals CNT1, CNT2, CNTB1, CNTB2, CNTC1 and CNTC2, which will be described later herein, the circuit of FIGS. 2A–2B operates as follows. AC coupling circuitry 20 is provided for the circuit 18 to eliminate discontinuities which would otherwise appear in the head current output of the circuit. The AC coupling circuitry 20 eliminates such discontinuities by controlling the current available to the base drive of switching transistors Q10 and Q13. The AC coupling circuitry includes transistors Q26 and Q27 and capacitors C0 and C1. The differential input voltage signals $V_{in0}$ and $V_{in1}$ operate between 4 VDC and 5 VDC and are AC coupled to the bases of transistors Q26 and Q27 through capacitors C0 and C1, respectively.

Because of this capacitive coupling, the bases of switching transistors Q10 and Q13 experience an AC transient when being turned on, but return to a steady state DC voltage after the transient is completed. Steady state operation, outside of the transient state, is referred to herein as the quiescent state.

Such AC coupled operation enhances the overall speed at which the transistors Q10 and Q13 are simultaneously switched, because the AC coupling eliminates the need for a large swing in voltage at the base of these transistors. Instead, the voltage at the bases of Q10 and Q13 need only undergo a voltage change equal to one half of the voltage drop which is applied across the inductive write head 12. Accordingly, the bases of switching transistors Q10 and Q13 need not experience a large DC swing during the switching transient which might otherwise contribute to base-emitter breakdown, given a supply voltage $V_{cc}$ of 12 volts.

To further protect the junction breakdown of the npn transistors in the circuit, a first grounded base stage is included in the circuit to isolate the current through R6 from transistors Q24 and Q26, and a second grounded base stage is provided to isolate the current through R7 from transistors Q25 and Q27. The first grounded base stage comprises transistor Q29 and voltage source E0 and the second grounded base stage comprises transistor Q31 and voltage source E1.

As in the operation of the prior art circuit of FIG. 1, current is routed through resistor R6 to turn transistor Q10 off (Q13 on) and current is routed through resistor R7 to turn transistor Q13 off (Q10 on). Current source J0 provides a DC bias current through resistor R4 to the base of transistor Q26, and current source J1 provides a DC bias current through resistor R5 to the base of transistor Q27. In addition, current source J6 provides a supply of current to the emitter of Q26 through resistor R2, and to the emitter of Q27 through resistor R3. Current source J6 is designed to be much larger than current source J5 because while only a small DC drive is needed to turn off Q10 and Q13 during the quiescent or steady state, a large AC drive is needed to guarantee the turn off of Q10 and Q13 during the switching transient.

During the quiescent state, the current from J6 is evenly split between Q26 and Q27, regardless of whether $V_{in0}-V_{in1}$ is positive or negative. At the beginning of the transient to turn Q10 off (Q13 on), immediately after $V_{in0}-V_{in1}$ switches positive, all of the current in J6 flows through Q26, turning Q27 off. The base of Q26 experiences an initial positive step of voltage coupled from $V_{in0}$ through capacitor C0 and then decays back to its bias voltage provided by current source J0. The base of Q27 experiences a corresponding negative step of voltage and then a decay back to its bias point, providing a voltage at the bottom of R6 (the collector of Q29) which is immediately pulled down from $V_{cc}-[(J6 \times R6)/2]$ and then decays back to $V_{cc}-[R6 \times (J6/2+J5)]$. The current through R6 thus decays throughout the transient. The fast downward swing of the collector voltage of isolation transistor Q29 is accompanied by a fast upward swing of the collector voltage of Q31. Because the time constant at which the R6 current decays corresponds to the inductive load time constant, no discontinuity is experienced in the current output waveform across the inductive write head 12 during the switching transient. Throughout the course of the transient, the current through Q27 slowly increases as capacitors C0 and C1 charge, until the quiescent state is again achieved, wherein both Q27 and Q26 are on, each transistor conducting half of the current of J6. After completion of this transient, a quiescent state is obtained wherein $V_{in0}-V_{in1}$ is positive, and thus Q24 is off and Q25 is on.

At the beginning of the transient to turn Q10 on (Q13 off), immediately after $V_{in0}-V_{in1}$ switches negative, all of the current in J6 flows through Q27, turning Q26 off. The base of Q27 experiences an initial positive step of voltage coupled from $V_{in1}$ through capacitor C1, and then decays back to its bias voltage provided by current source J1. The base of Q26 experiences a corresponding negative step of voltage and then a decay back to its bias point, providing a voltage at the bottom of R7 (the collector of Q31) which is immediately pulled down from $V_{cc}-[(J6 \times R7)/2]$ and then decays back to $V_{cc}-[R7 \times (J6/2+J5)]$. The current through R7 thus decays throughout the transient. The fast downward swing of the collector voltage of isolation transistor Q31 is accompanied by a fast upward swing of the collector voltage of Q29. Because the time constant at which the R7 current decays corresponds to the inductive load time constant, no discontinuity is experienced in the current output waveform across the inductive write head 12 during the switching transient. Throughout the course of the transient, the current through Q26 slowly increases as capacitors C0 and C1 charge, until the quiescent state is again achieved, wherein both Q27 and Q26 are on, each transistor conducting half of the current of J6. After completion of the transient, a quiescent state is obtained wherein $V_{in0}-V_{in1}$ is negative, and thus Q24 is off and Q25 is on.

The upper portion of the circuit 18 outside of the AC coupling circuitry 20 provides control circuitry for controlling the switching of the bases of transistors Q10 and Q13, while preventing junction breakdown of transistors in the circuit 18. R6 is connected to the base of Q10 through PFET T0, and R7 is connected to the base of Q13 through PFET T4. PFETs T0 and T4 provide relatively low resistance so that R6 and R7 are effectively coupled to the bases of Q10 and Q13, respectively, helping to maintain a relatively constant voltage on the bases of Q10 and Q13 during steady state operation.

Figure 3:
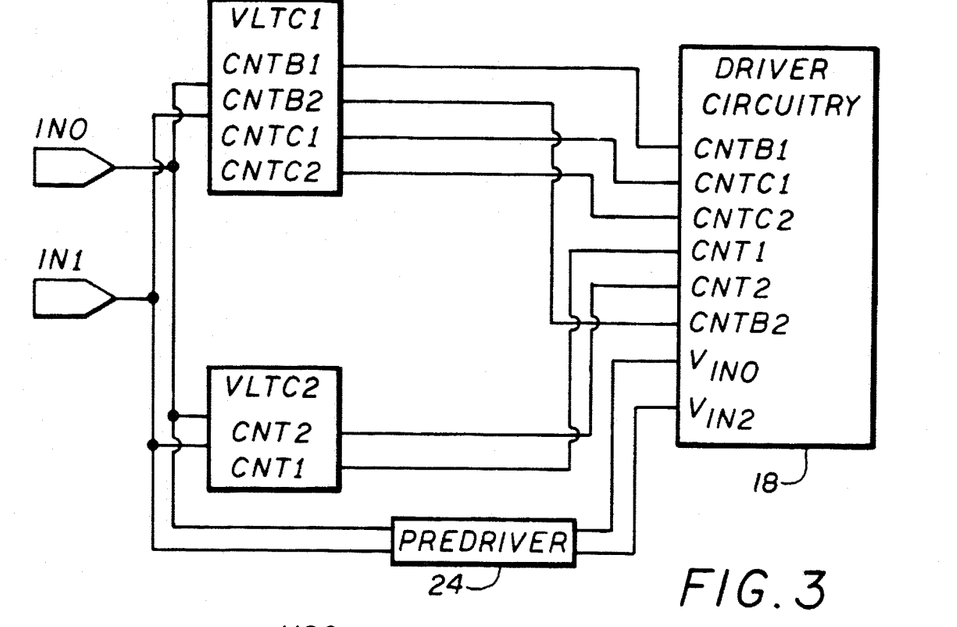
FIG. 3 is a block diagram of the control circuitry used in conjunction with the circuit of FIG. 2A–2B.
Figure 4:
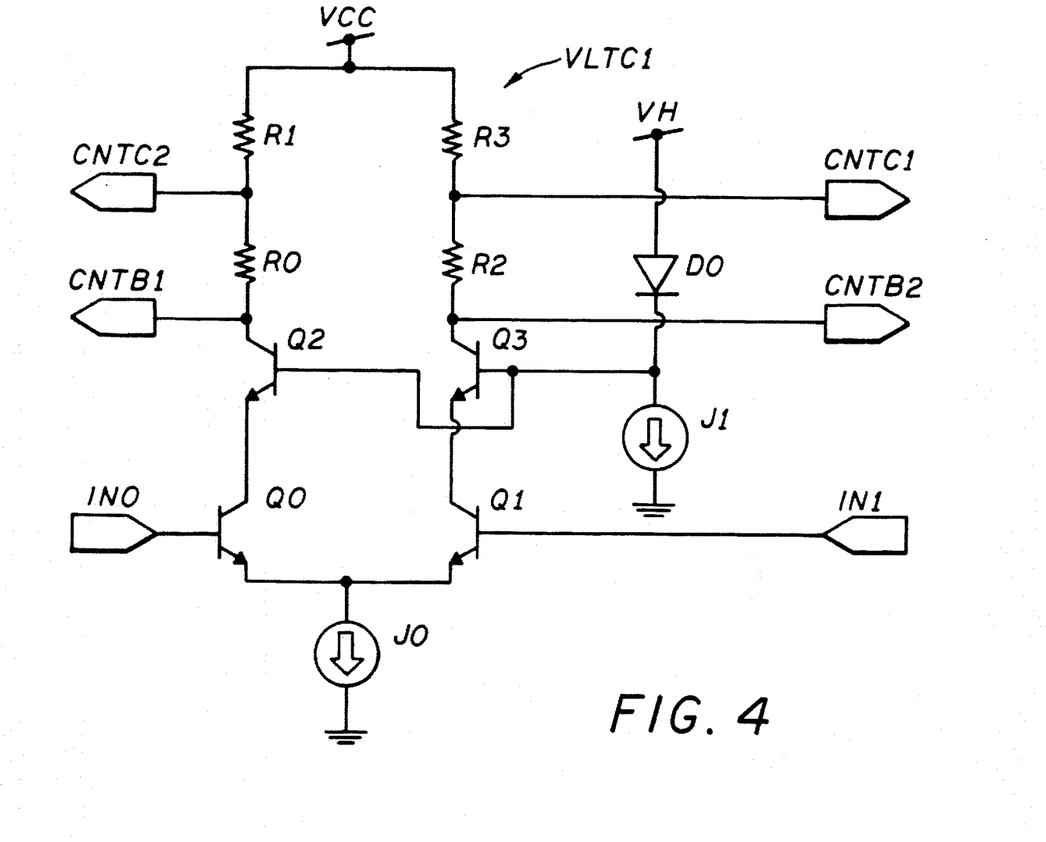
FIGS. 4 and 5 are schematic diagrams of voltage level translation circuits contained in the control circuitry of FIG. 3.
Figure 5:
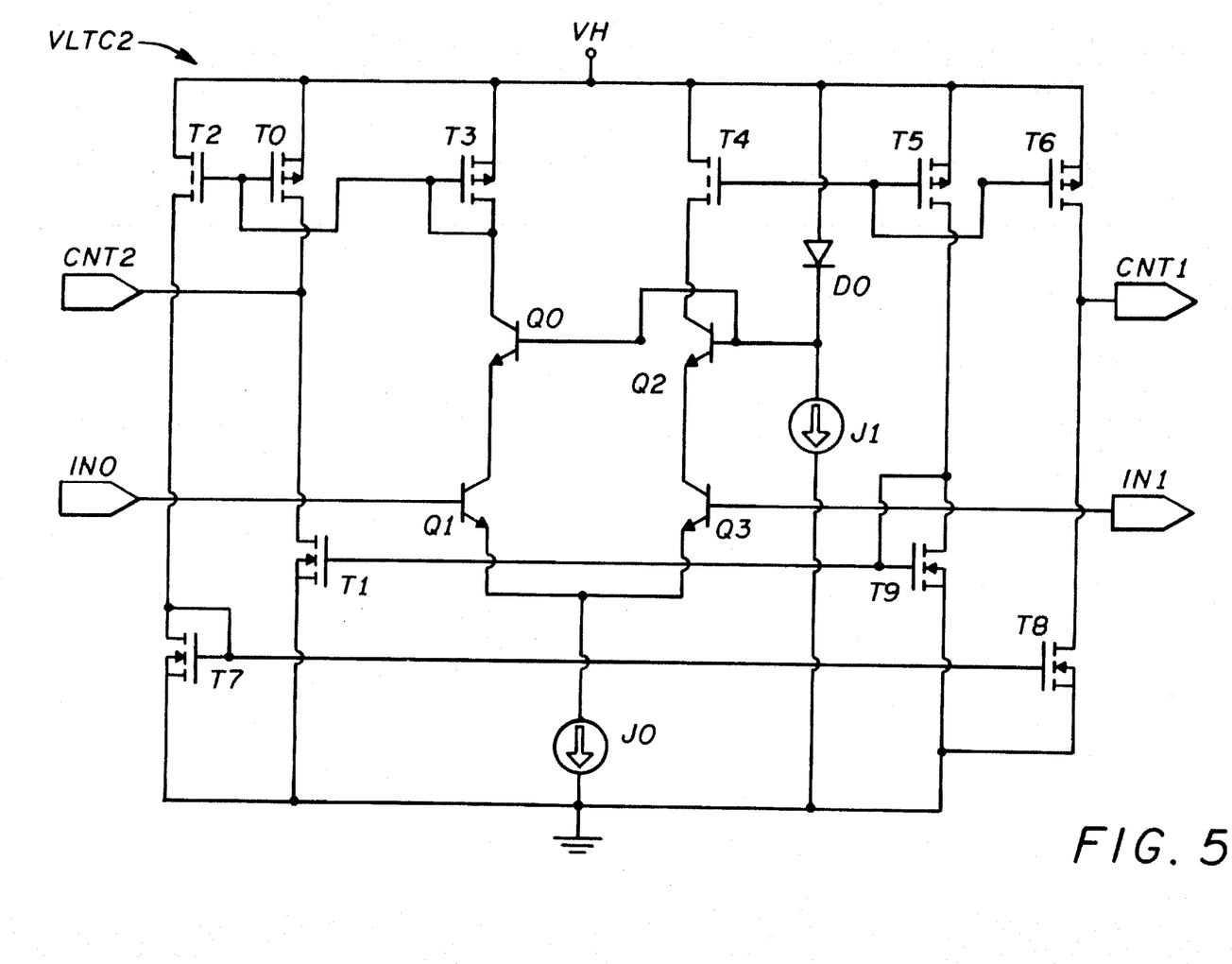

The switching of the FETs in the circuit 18 are controlled by the control signals CNT1, CNT2, CNTB1, CNTB2, CNTC1 and CNTC2. FIG. 3 is a block diagram of the control circuitry used to provided these control signals, and FIGS. 4 and 5 are electrical schematic diagrams of the voltage level translation circuits contained in the control circuitry of FIG. 3. The voltage levels of these signals are shown in the graphical representation of FIG. 6. As shown in FIG. 3, a first voltage level translation circuit VLTC1 outputs control signals CNTB1, CNTB2, CNTC1, and CNTC2 to circuit 18, and a second voltage level translation circuit VLTC2 outputs control signals CNT1 and CNT2 to circuit 18. The purpose of the control signals is to provide a voltage sufficiently low to prevent junction breakdown of npn devices in the circuit 18, as well as limiting drain-to-source voltages on the FETs to less than their breakdown limit, which typically might be expected to occur above five volts. Voltage signals $IN_0$ and $IN_1$ are used as inputs to the voltage level translation circuits VLTC1 and VLTC2. The input signals $IN_0$ and $IN_1$ are also applied to a pre-driver circuit 24 for conditioning before being applied to the circuit 18. The difference between $V_{in0}$ and $IN_0$ (and similarly between $V_{in1}$ and $IN_1$) is that the pre-driver circuit 24 lowers the impedance of its output $V_{in0}$ as compared to the input $IN_0$ (and similarly between $V_{in1}$ and $IN_1$). The pre-driver circuit 24 operates in parallel with the voltage level translation circuits VLTC1 and VLTC2, which are shown in more detail in FIGS. 4 and 5, respectively.

Figure 6:
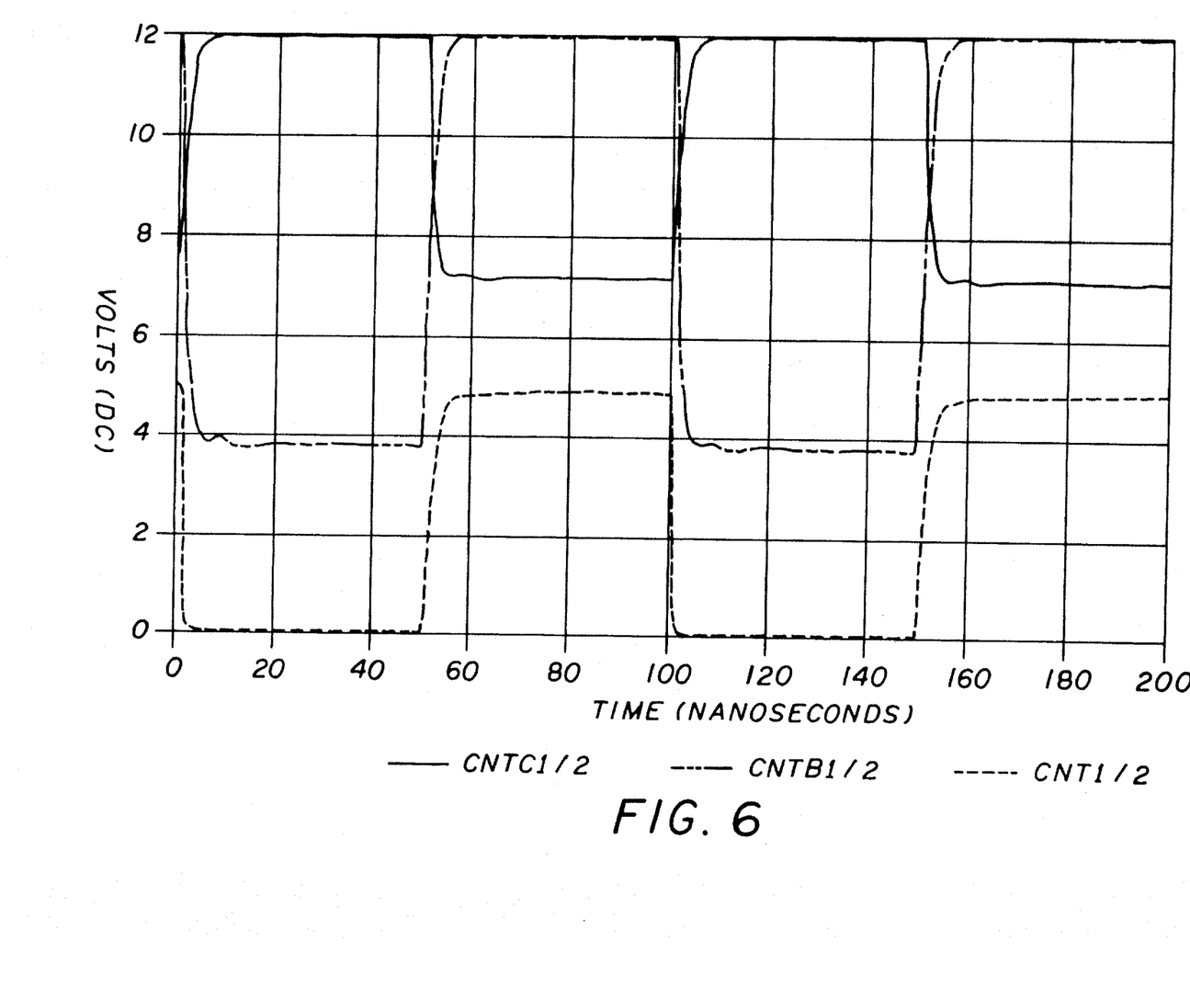
FIG. 6 is a graphical representation of the outputs of the voltage level translation circuits of FIGS. 4 and 5.

With respect to the voltage level translation circuit VLTC1 of FIG. 4, when $IN_0-IN_1$ is positive, i.e. $IN_0$ is at 5 VDC and $IN_1$ is at 4 VDC, the current from current source J0 flows through transistor Q0 and transistor Q2 functions as a grounded base isolation device so that its current flows through R0 and R1. Because $V_{cc}$ is at 12 VDC and resistors R0 and R1 each experience a voltage drop of about 4 volts due to the current flowing through them, CNTC2 is at about 8 VDC, and CNTB1 would be at about 4 VDC. Because Q1 is off and therefore no current flows through resistors R2 and R3, no voltage drop is experienced across these resistors, and thus CNTC1 and CNTB2 remain at the supply voltage $V_{cc}$ of 12 VDC. When $IN_0-IN_1$ is negative, i.e. $IN_0$ is at 4 VDC and $IN_1$ is at 5 VDC, the current from current source J0 flows through transistor Q1 and transistor Q3 functions as a grounded base isolation device so that its current flows through R2 and R3. Because $V_{cc}$ is at 12 VDC and resistors R2 and R3 each experience a voltage drop of about 4 volts due to the current flowing through them, CNTC1 is at about 8 VDC, and CNTB2 would be at 4 VDC. CNTC2 and CNTB1 remain at the supply voltage $V_{cc}$ of 12 VDC because Q0 is off and thus no current flows through resistors R0 or R1. Accordingly, as shown in FIG. 6, control signals CNTC1 and CNTC2 occupy logic levels of about 8 volts LOW and 12 volts HIGH, and control signals CNTB1 and CNTB2 occupy logic levels of about 4 volts LOW and 12 volts HIGH.

With respect to the voltage level translation circuit VLTC2 of FIG. 5, when $IN_0-IN_1$ is positive, the current in current source J0 flows through transistor Q1 up through isolation transistor Q0 and into NFET T3 and is mirrored in PFETs T0 and T2. As a result, CNT2 is at 5 VDC. CNT1 is pulled low to zero volts because the current in T2 flows through T7 and is mirrored in T8. If, however, $IN_0-IN_1$ is negative, the current in current source J0 flows through transistor Q3 up through isolation transistor Q2 and into PFET T4 and is mirrored in PFETs T5 and T6. Thus, CNT1 is at 5 VDC, and CNT2 is at zero volts (also see FIG. 6).

Referring back to FIGS. 2A–2B now, when $V_{in0}-V_{in1}$ goes negative (Q13 off, Q10 on), Q21 is also turned off to lower the emitter-collector voltage on Q13. Thus, Q21 takes half the voltage drop between $V_{cc}$ and output 16, thereby preventing the emitter-collector breakdown of switching transistor Q13. To turn Q21 off, T11 is turned on and T10 is turned off, shorting the emitter-base junction of Q21, which serves to further prevent emitter-collector breakdown of Q21.

Thus, during the turn on of Q10 and turn off of Q13, Q21 is effectively used as a switch to disconnect the collector of Q13 from the positive voltage supply $V_{cc}$. Therefore, as Q5 is being turned on, Q13 is floating while its emitter is experiencing voltage swings, thus guaranteeing that no portion of the total collector current of Q5 is coming from Q13. The control circuitry operates as follows during this operation. PFET T10 is turned off by driving CNTC2 high and PFET T11 is turned on by pulling CNTC1 low. NFET T6 is turned on by driving CNT1 high NFET T7 is turned off by driving CNT2 low. Simultaneously, PFET T5 is turned on by driving CNTB2 low. On the other side of the circuit, the gate of PFET T0 is pulled below $V_H$ (5 volts) because diode D0 begins to conduct when NFET T2 turns on. To ensure that the source voltage of T0 does not exceed the gate voltage by five volts, zener diode D2 begins to conduct to prevent breakdown. T0 is therefore prevented from breaking down but remains on, connecting the base of Q10 to the collector of Q29 and turning on Q10.

When $V_{in0}-V_{in1}$ goes positive (Q13 on, Q10 off), Q17 is also turned off to lower the emitter-collector voltage on Q10. Thus, Q17 takes half the voltage drop between $V_{cc}$ and output 14, thereby preventing the emitter-collector breakdown of switching transistor Q10. To turn Q17 off, T9 is turned on and T8 is turned off, shorting the emitter-base junction of Q17, which serves to further prevent emitter-collector breakdown of Q17.

Thus, during the turn off of Q10 and turn on of Q13, Q17 is effectively used as a switch to disconnect the collector of Q10 from the positive voltage supply $V_{cc}$. Therefore, as Q0 is being turned on, Q10 is floating while its emitter is experiencing voltage swings, thus guaranteeing that no portion of the total collector current of Q0 is coming from Q10. The control circuitry operates as follows during this operation. PFET T8 is turned off by driving CNTC1 high and PFET T9 is turned on by pulling CNTC2 low. NFET T3 is turned on by driving CNT2 high NFET T2 is turned off by driving CNT1 low. Simultaneously, PFET T1 is turned on by driving CNTB1 low. On the other side of the circuit, the gate of PFET T4 is pulled below $V_H$ (5 volts) because diode D1 begins to conduct when NFET T7 turns on. To ensure that the source voltage of T4 does not exceed the gate voltage by five volts, zener diode D3 begins to conduct to prevent breakdown. T4 is therefore prevented from breaking down but remains on, connecting the base of Q13 to the collector of Q31 and turning on Q13.

The switching scheme described above permits rapid switching of switching transistors Q10 and Q13 without breaking down these switching transistors or any of the FETS in the circuit. In either switching operation, the AC coupling circuitry of the present invention permits the bases and emitters of these transistors to swing through less of a voltage range than if the input signals were DC coupled to the circuit, resulting in considerably less switching time. The 12 VDC power supply provides enough range for the voltage swings experienced by the switching transistors such that neither of Q0 or Q5 go into saturation. Thus, the resulting head current waveform output by the circuit 18 is distortionless.

Figure 7:
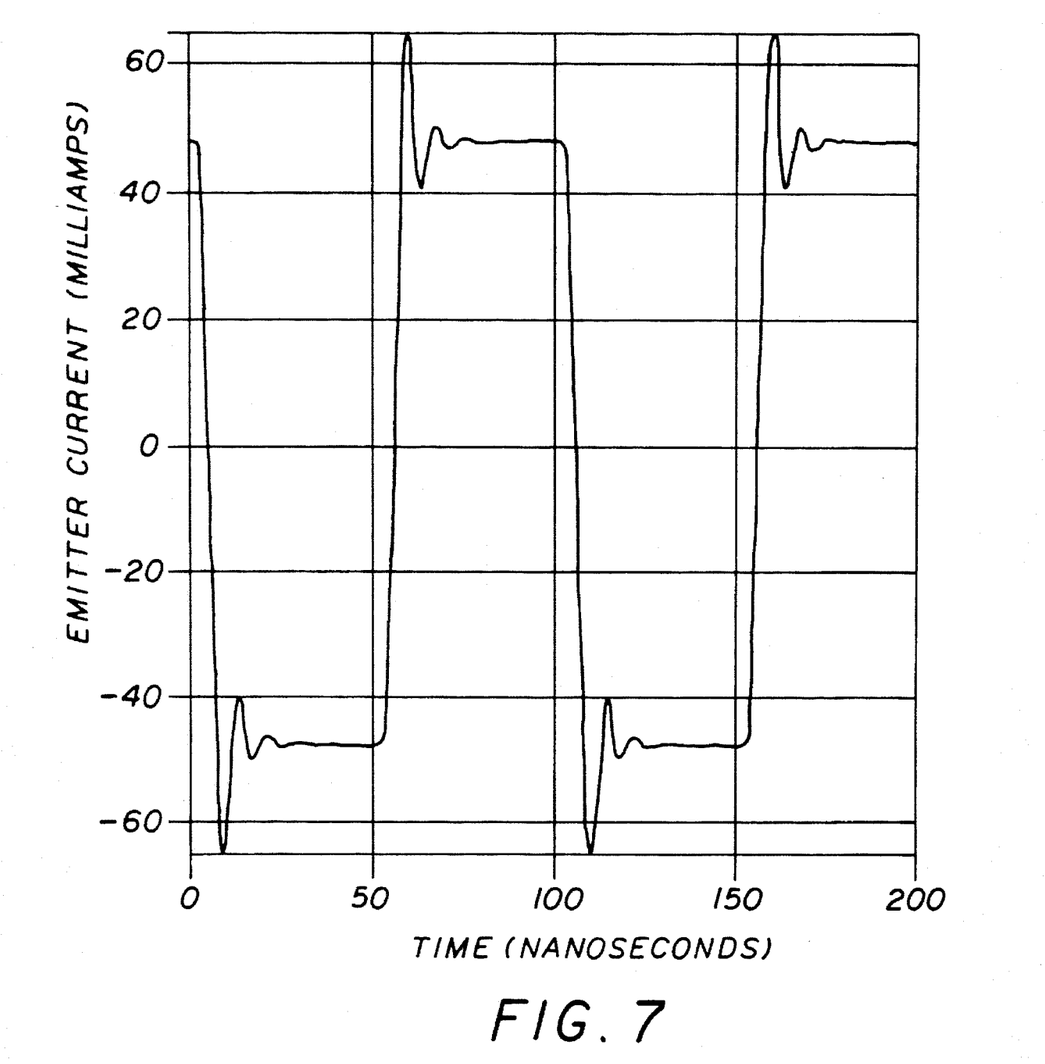
FIG. 7 is graphical representation of the electrical current passing through the memory write head of the circuit of FIG. 2, as measured at the emitters of switching output transistors in the circuit.
Figure 8:
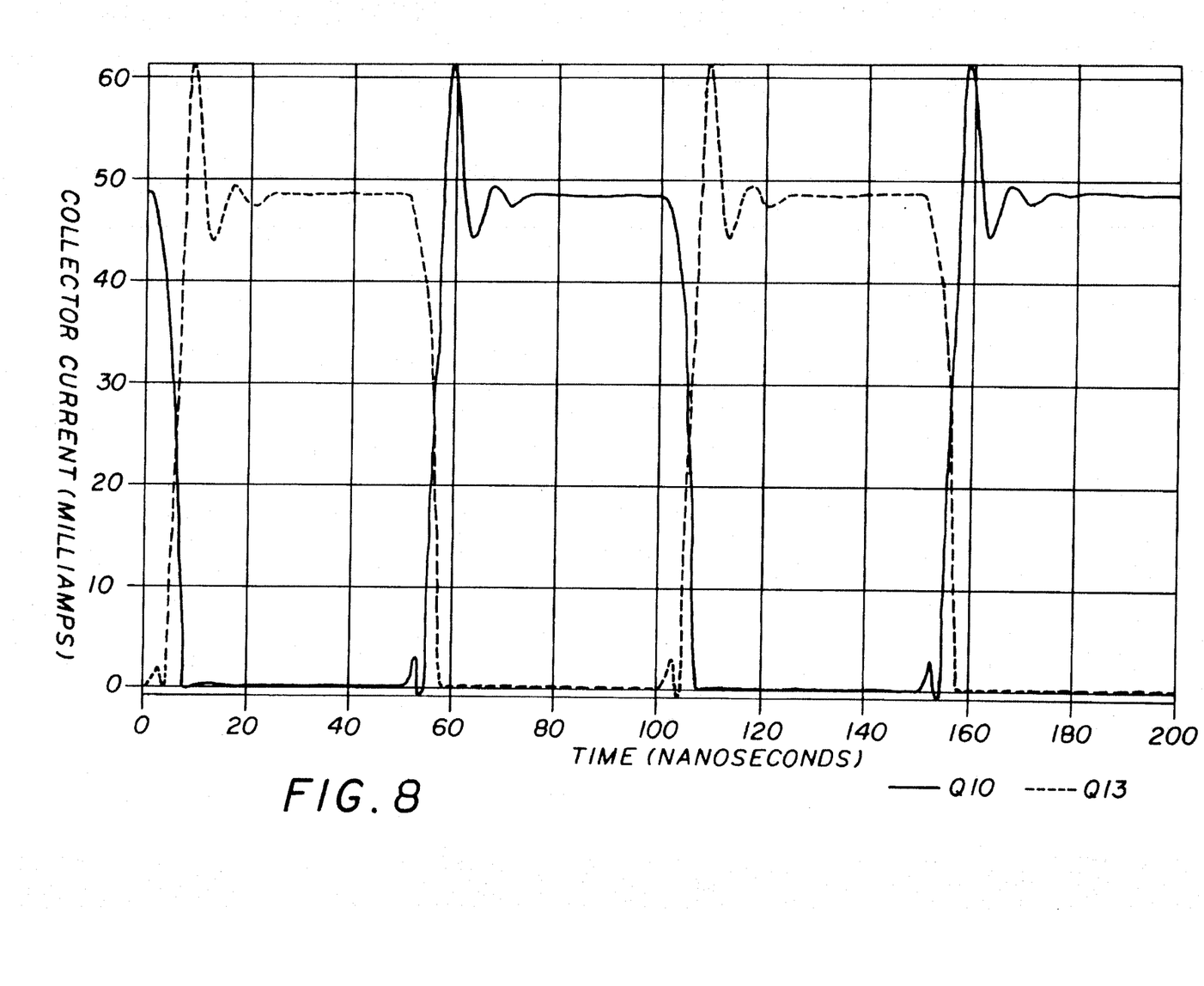
FIG. 8 is graphical representation of electrical current measured at the collectors of switching output transistors in the circuit of FIG. 2.

A sample head current output waveform is shown in FIG. 7, as measured at the emitters of switch outputs 14 and 16 (the emitters of transistors Q10 and Q13, respectively) in the circuit of FIG. 2. FIG. 8 is a graphical representation of electrical current measured at the collectors of switching output transistors Q10 and Q13. As shown, the circuit 18 is capable of switching between −60 milliamps and +60 milliamps (for a total range of 120 milliamps). Switching cycle times of approximately 100 nanoseconds and switching transient times of approximately 4.4 nanoseconds are obtained. Absent the switching mechanism provided by the present invention, distortion would be experienced as a discontinuity in the waveform near zero current.

Accordingly, the preferred embodiment of a low distortion memory write current head driver circuit has been described. With the foregoing description in mind, however, it is understood that this description is made only by way of example, and that various changes may be implemented without departing from the true spirit of the invention as hereinafter claimed.

We claim:

1. A current switching driver circuit having inputs for first and second differential input signals, comprising:

at least one voltage supply of at least ten volts DC for generating a first current source of electrical current to be switched;

first and second switching paths for switching said source of current in response to said first and second differential input signals, said first path comprising first and second switching devices, said second path comprising third and fourth switching devices, said first and second differential input signals being coupled, respectively, to said second and fourth switching devices, said first current source being coupled to said first and third switching devices;

output terminals through which a load is connected and switched current is routed, said output terminals common to both of said first and second switching paths and being located between said first and fourth switching devices and between said second and third switching devices; and an AC coupling circuit coupled to said first and third switching devices for controlling current available to said first and third switching devices, said AC coupling circuit comprising (i) a second current source, (ii) first and second capacitors each of which is directly coupled at a first end to said first and second differential input signals, respectively, and at a second end to fifth and sixth switching devices, respectively, (iii) said fifth and sixth switching devices coupled to said second current source, and respectively coupled to said first and third switching devices in response to said first and second differential input signals; said fifth switching device coupled between said first switching device and said second end of said first capacitor, said sixth switching device coupled between said third switching device and, said second end of said second capacitor.

2. The driver circuit of claim 1, wherein said first through sixth switching devices are transistors.

3. The driver circuit of claim 2, wherein said voltage supply operates at a voltage of about twelve volts DC.

4. The driver circuit of claim 2, wherein said first and second differential input signals have a differential of about one volt DC.

5. The driver circuit of claim 2, wherein said first through sixth transistors are bipolar npn-type switching transistors.

6. The driver circuit of claim 5, wherein said circuit switches up to 120 milliamps of current range in less than five nanoseconds.

7. The driver circuit of claim 1, further comprising pre-driver circuitry connected to said inputs of said current switching driver circuit, said pre-driver circuitry operating to lower the impedance of said first and second differential input voltage signals.

8. A current switching driver circuit having inputs for first and second differential input signals comprising:

at least one voltage supply for generating a first current source of electrical current to be switched;

first and second switching paths for switching said source of current in response to said first and second differential input signals, said first path comprising first and second switching devices, said second path comprising third and fourth switching devices, said first and second differential input signals being coupled, respectively, to said second and fourth switching devices, said first current source being coupled to said first and third switching devices;

output terminals through which a load is connected and switched current is routed, said output terminals common to both of said first and second switching paths and being located between said second and third switching devices and between said first and fourth switching devices; and disconnect circuitry for reducing distortion of output current flowing through a load connected to said output terminals, said disconnect circuitry comprising (i) a fifth switching device connected between said first current source and said first switching device for disconnecting said first switching device from said voltage supply when current flows through said first switching path, and (ii) a sixth switching device connected between said first current source and said third switching device for disconnecting said third switching device from said voltage supply when current flows through said second current path.

9. The driver circuit of claim 8 further comprising AC coupling circuitry coupled to said first and third switching devices for further reducing distortion of output current flowing through a load connected to said output terminals by controlling the current available to said first and third switching devices, said AC coupling circuitry comprising (i) a seventh switching device coupled to said first differential input signal by a first capacitor and (ii) an eighth switching device coupled to said second differential input signal by a second capacitor.

10. The driver circuit of claim 9, wherein said voltage supply operates at a voltage of at least ten volts.

11. The driver circuit of claim 8, further comprising pre-driver circuitry connected to said inputs of said current switching driver circuit, said pre-driver circuitry operating to lower the impedance of said first and second differential input voltage signals.

12. The driver circuit of claim 8, wherein said circuit switches up to 120 milliamps of current range in less than five nanoseconds.

13. A current switching driver circuit having inputs for first and second differential input signals, comprising:

at least one high voltage supply of at least ten volts DC for generating a first current source of electrical current to be switched;

first and second switching paths for switching said source of current in response to said first and second differential input signals, said first path comprising first and second switching devices, said second path comprising third and fourth switching devices, said first and second differential input signals being coupled, respectively, to said second and fourth switching devices, said first current source being coupled to said first and third switching devices;

output terminals through which a load is connected and switched current is routed, said output terminals common to both of said first and second switching paths and being located between said first and fourth switching devices and between said second and third switching devices; and an AC coupling circuit coupled to said first and third switching devices for controlling electrical current available to said first and third switching devices to prevent emitter-base junction breakdown of said first and third switching devices when controlling output current distortion through said output terminals during switching of electrical current using said high voltage supply, said AC coupling circuitry comprising (i) a second current source, (ii) first and second capacitors each of which is directly coupled at a first end to said first and second differential input signals, respectively, and at a second end to fifth and sixth switching devices, respectively, (iii) said fifth and sixth switching devices coupled to said second current source, and respectively coupled to said first and third switching devices in response to said first and second differential input signals; said fifth switching device coupled between said first switching device and said second end of said first capacitor, said sixth switching device coupled between said third switching device and said second end of said second capacitor.

14. The circuit of claim 13, wherein said first through sixth switching devices are transistors.

15. The circuit of claim 14, wherein said high voltage supply operates at about twelve volts DC.

16. The circuit of claim 14, wherein said first and second differential input signals have a differential of about one volt DC.

17. The circuit of claim 14 wherein said first through sixth transistors are bipolar npn-type switching transistors.

18. The circuit of claim 17, further comprising pre-driver circuitry connected to said inputs of said current switching driver circuit, said pre-driver circuitry operating to lower the impedance of said first and second differential input voltage signals.

19. The circuit of claim 17, wherein said circuit switches up to 120 milliamps of current range in less than five nanoseconds.

* * * * *